US012621935B2

(12) United States Patent
Park

(10) Patent No.: US 12,621,935 B2
(45) Date of Patent: May 5, 2026

(54) REEL-TO-REEL CIRCUIT BOARD MANUFACTURING APPARATUS

(71) Applicant: HAESUNG DS CO., LTD., Gyeongsangnam-do (KR)

(72) Inventor: Chonghan Park, Gyeongsangnam-do (KR)

(73) Assignee: HAESUNG DS CO., LTD, Gyeongsangnam-Do (KR)

( * ) Notice: Subject to any disclaimer, the term of this patent is extended or adjusted under 35 U.S.C. 154(b) by 648 days.

(21) Appl. No.: 17/932,128

(22) Filed: Sep. 14, 2022

(65) Prior Publication Data

US 2023/0102076 A1      Mar. 30, 2023

(30) Foreign Application Priority Data

Sep. 30, 2021      (KR) .......................... 10-2021-0130306

(51) Int. Cl.
*H05K 3/00*          (2006.01)
*B05C 1/08*          (2006.01)
(52) U.S. Cl.
CPC ......... *H05K 3/0091* (2013.01); *B05C 1/0808* (2013.01); *H05K 2203/0143* (2013.01)
(58) Field of Classification Search
CPC .................... H05K 2203/0143; B05C 1/08–12
See application file for complete search history.

(56) References Cited

U.S. PATENT DOCUMENTS

| | | | | |
|---|---|---|---|---|
| 5,709,747 A | * | 1/1998 | Goldwasser | ............. D04H 1/42 |
| | | | | 118/263 |
| 2004/0211361 A1 | * | 10/2004 | Suzuki | ................. B05C 11/028 |
| | | | | 118/77 |
| 2015/0343480 A1 | * | 12/2015 | Byrne | ..................... B41F 31/22 |
| | | | | 401/208 |
| 2017/0368858 A1 | * | 12/2017 | Rattray | ................... B41M 1/26 |

FOREIGN PATENT DOCUMENTS

| | | |
|---|---|---|
| CN | 202043383 | 11/2011 |
| TW | 500290 | 8/2002 |

OTHER PUBLICATIONS

KR 20100000167A Full text and translatio (Year: 2010).*

* cited by examiner

*Primary Examiner* — Dah-Wei D. Yuan
*Assistant Examiner* — Stephen A Kitt
(74) *Attorney, Agent, or Firm* — Perman & Green, LLP

(57)          ABSTRACT

A reel-to-reel circuit board manufacturing apparatus according to an embodiment of the present disclosure includes: a roller having a cylindrical shape, configured to rotate, and on which a substrate is wound; and a film body that is formed between the roller and the substrate to surround a surface of the roller and is rotatable, wherein the roller and the film body are separately rotated from each other.

12 Claims, 8 Drawing Sheets

100

REEL-TO-REEL CIRCUIT BOARD MANUFACTURING APPARATUS

CROSS-REFERENCE TO RELATED APPLICATION

This application is based on and claims priority under 35 U.S.C. § 119 to Korean Patent Application No. 10-2021-0130306, filed on Sep. 30, 2021, in the Korean Intellectual Property Office, the disclosure of which is incorporated by reference herein in its entirety.

BACKGROUND

1. Field

One or more embodiments of the disclosure relate to a reel-to-reel circuit board manufacturing apparatus.

2. Description of the Related Art

Industry groups in which a circuit is formed on a reel or a film, from among the industries for manufacturing circuit boards, include industries regarding lead frame, flexible printed circuit board (FPCB), chips on film (COF), PCB, etc. Semiconductor packages are completed through processes of forming a photoresist on a substrate, forming a circuit pattern layer through a plating or an etching process, forming a solder resist layer on the circuit pattern layer, mounting a semiconductor chip, electrically connecting the circuit pattern layer and the semiconductor chip, and molding by using a molding material.

Semiconductor circuit boards may be classified as rigid substrates, such as flame retardant-4 (FR-4) or bismaleimid triazine (BT), and flexible substrates having flexibility, such as polyimide. However, various rigid substrates having reduced thickness, like flexible substrates, may be manufactured by using a reel-to-reel manufacturing method. In particular, thin semiconductor packages have been developed recently, and a thickness of a circuit board has been also reduced. Thus, a reel-to-reel process may be applied.

Methods of manufacturing circuit boards may be classified into panel manufacturing methods and reel manufacturing methods. According to the panel manufacturing method, individual panels are separately conveyed and processed, and then, laminated after finishing processes. According to the reel manufacturing method, a reel is wound on a cylindrical paper tube and continuously conveyed to be processed, and then, wound as a reel after finishing the process.

FIGS. 1A and 1B are diagrams for describing issues in a reel manufacturing method according to the related art. FIG. 1A is a diagram showing a difference between the rotating speeds of a roller and a substrate, and FIG. 1B is a diagram showing a speed difference of a substrate in a width direction of a roller.

According to the reel manufacturing method, a substrate is in contact with structures in pieces of equipment less than in a panel process, and thus, a circuit is less likely to be damaged. However, in the reel manufacturing method, in order to prevent tension and skewing, the reel may not be directly wound after the process, and the substrate may be wound up and down on various rollers. Since products come into contact with the roller, a risk of damaging the circuit may increase. Therefore, it is required that the velocity of the roller matches the substrate velocity, and thus, the substrate may not rub against a surface of the roller.

However, a local friction may occur between the substrate and the roller because the substrate does not come into contact with the roller in parallel, and as shown in FIG. 1A, a velocity V1 of the substrate and a velocity V2 of the roller may not be completely equal to each other. In addition, even when a free roller is rotated according to the velocity of the substrate in a way of freely driving a driving roller by using the free roller, the roller having a relatively greater weight may not match the velocity of the substrate when there is a difference between velocities of the substrate and the roller, and thus, the substrate and the roller may rub against each other.

Also, as shown in FIG. 1B, tensions on left and right sides of the substrate contacting the roller may be different from each other, and thus, a difference between the velocities (V3 and V4) of the left and right sides of the substrate may occur locally.

Also, the driving roller may be formed of a plastic or metal material. In this case, even when the surface is precisely polished, there may be a limitation in controlling roughness on the surface of the roller. The roughness of a metal material may be controlled through coating or precise polishing, but due to the heavy weight, the circuit is inevitably damaged when the circuit having a size of tens of micrometers rubs against the roller.

SUMMARY

One or more embodiments of the present disclosure provide a reel-to-reel circuit board manufacturing apparatus capable of reducing damage to a substrate.

However, the above technical features are exemplary, and the scope of the disclosure is not limited thereto.

Additional aspects will be set forth in part in the description which follows and, in part, will be apparent from the description, or may be learned by practice of the presented embodiments of the disclosure.

A reel-to-reel circuit board manufacturing apparatus according to an embodiment of the present disclosure includes: a roller having a cylindrical shape, configured to rotate, and on which a substrate is wound; and a film body that is formed between the roller and the substrate to surround a surface of the roller and is rotatable, wherein the roller and the film body are separately rotated from each other.

A frictional force between the film body and the substrate may be greater than a frictional force between the film body and the roller.

The film body may include a thin plate film.

The reel-to-reel circuit board manufacturing apparatus may further include a coating portion coated on the surface of the roller.

The coating portion may be arranged between the roller and the film body and may be integrally rotated along with the roller.

The coating portion may include a fluoride-based release coating agent.

The coating portion may include a silicone-based release coating agent.

The film body may be moved in a width direction of the roller on the basis of the roller.

The roller may include a first roller and a second roller, the film body may include a first film body and a second film body, and the first film body may surround the first roller and the second film body surrounds the second roller.

The reel-to-reel circuit board manufacturing apparatus may further include: a first coating portion arranged between the first roller and the first film body; and a second coating portion arranged between the second roller and the second film body.

The reel-to-reel circuit board manufacturing apparatus may further include a bearing arranged between the roller and the film body.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1A is a diagram showing a difference between rotating speeds of a roller and a substrate, and FIG. 1B is a diagram showing a difference between velocities of a substrate in a width direction of a roller.

DETAILED DESCRIPTION

Figure 1A:
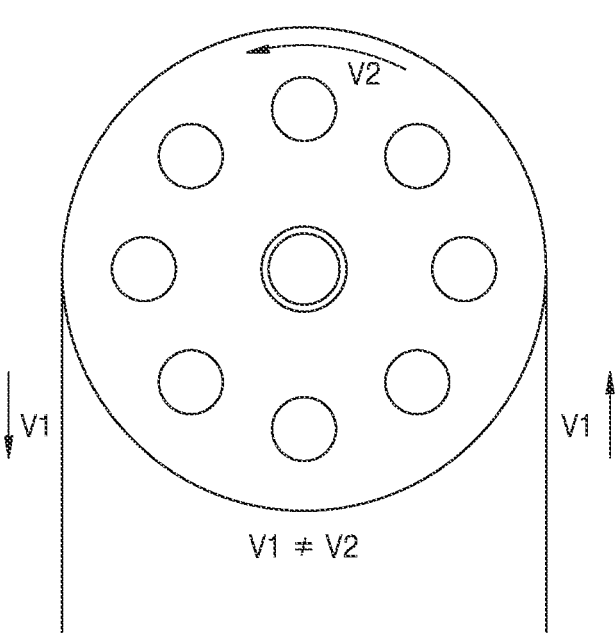
FIGS. 1A and 1B are diagrams for describing issues in a reel manufacturing method according to the related art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. However, this is not intended to limit the present disclosure to particular modes of practice, and it is to be appreciated that all modifications, equivalents, and/or alternatives that do not depart from the spirit and technical scope are encompassed in the disclosure. In describing the present disclosure, like reference numerals denote the same elements even when the elements are provided in another embodiment.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

The terms used in the present specification are merely used to describe particular embodiments, and are not intended to limit the present disclosure. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, referring to FIGS. 2 and 3, a reel-to-reel circuit board manufacturing apparatus according to an embodiment of the present disclosure will be described below.

Figure 2:
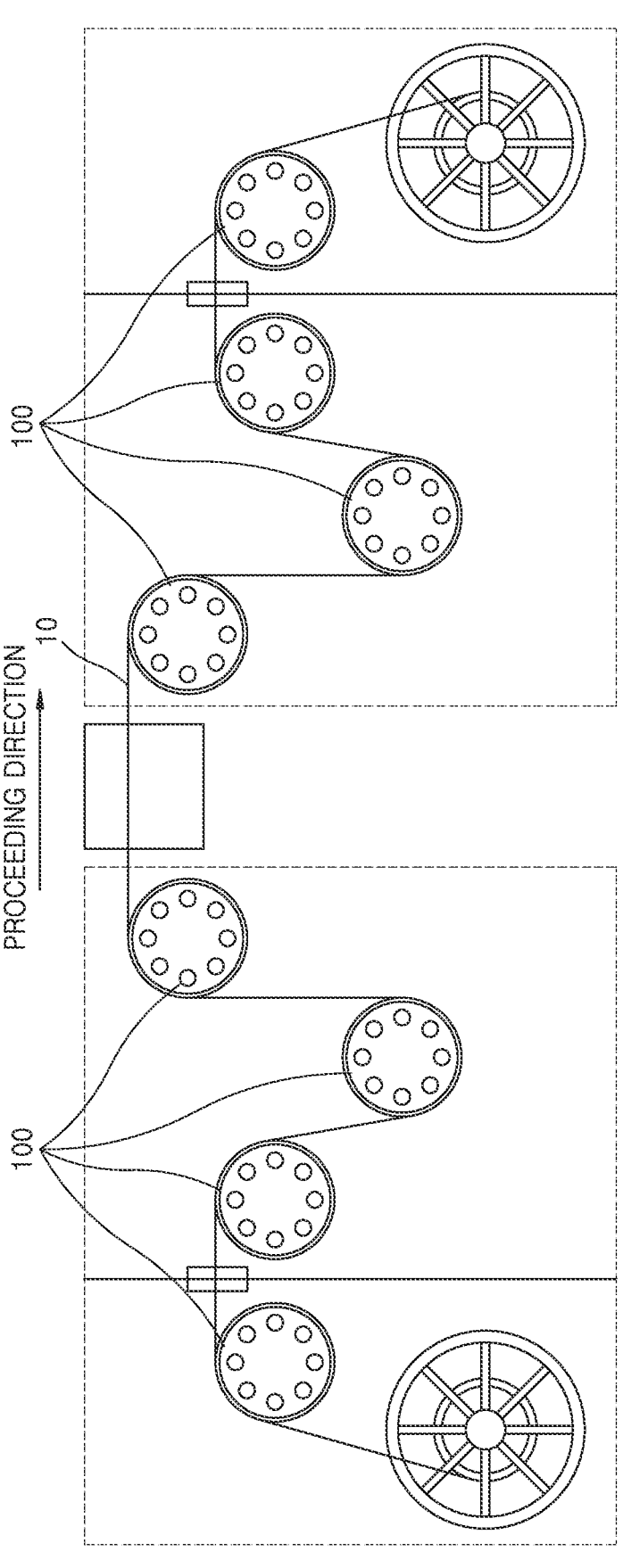
FIG. 2 is a diagram of a reel-to-reel circuit board manufacturing apparatus according to an embodiment of the present disclosure.
Figure 3A:
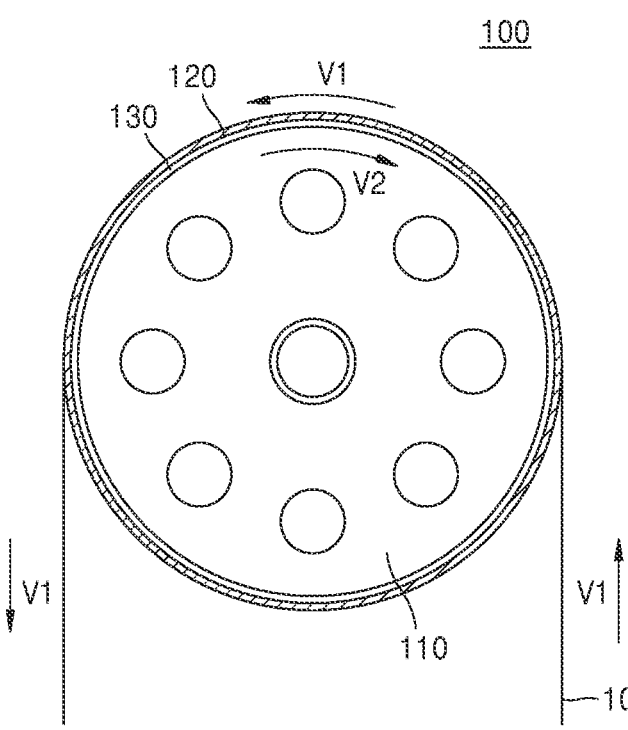
FIGS. 3A and 3B are diagrams showing a structure of a reel according to an embodiment of the present disclosure.
Figure 3B:
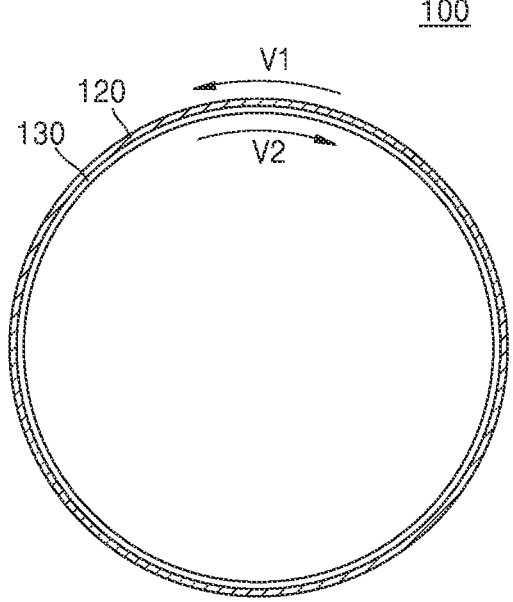

FIG. 2 is a diagram of a reel-to-reel circuit board manufacturing apparatus according to an embodiment of the present disclosure. FIGS. 3A and 3B are diagrams showing a structure of a reel according to an embodiment of the present disclosure.

Referring to FIGS. 2 and 3, the reel-to-reel circuit board manufacturing apparatus according to an embodiment of the present disclosure includes a roller 110 which is formed as a cylinder, is rotatable, and on which a substrate 10 is wound, and a film body 120 formed between the roller 110 and the substrate 10 to surround the surface of the roller 110 and being rotatable. Here, the roller 110 and the film body 120 are separately rotated.

In particular, a frictional force between the film body 120 and the substrate 10 may be greater than that between the film body 120 and the roller 110. That is, the film body 120 formed to surround the surface of the roller 110 is rotated along with the substrate 10 and separately from the roller 110, and thus, releasing property between the rotations of the film body 120 and the roller 110 may be secured. As shown in FIG. 3, the substrate 10 and the film body 120 rotated along with the substrate 10 may be rotated in one direction at a velocity of V1, and the roller 110 that is separately rotated with the film body 120 may be rotated in one direction or in the other direction at a velocity of V2.

When the substrate 10 and the film body 120 are rotated along with each other at the same speed, the friction between the substrate 10 and a reel may be reduced, and various damages such as scratch, etc. to circuit structures such as a photoresist circuit, a copper circuit, nickel, gold, etc. on the surface of the substrate 10 may be reduced.

The film body 120 according to an embodiment of the present disclosure may include a thin plate film. Therefore, the film body 120 may reduce the increase in a weight of the reel through the thin plate film structure that is formed to be thin and light.

The material of the thin plate film may have a hardness and rigidity less than those of the material forming the substrate. As such, during the movement of the substrate, the thin plate film may be moved along with the substrate at the same speed with reduced frictional force.

According to an embodiment of the present disclosure, a coating portion 130 may be further formed on the surface of the roller 110. The coating portion 130 may be arranged between the roller 110 and the film body 120, and may be coupled to the roller 110 to be rotated integrally with the roller 110.

A surface of the coating portion 130 facing the film body 120 is formed to be smooth, and the frictional force between the film body 120 and the coating portion 130 may be reduced so that the film body 120 slides on the surface of the coating portion 130. Thus, the film body 120 and the coating portion 130 may be separately rotated. As described above, the coating portion 130 having the smooth surface may be formed of a fluorine-based release coating agent or a silicon-based release coating agent.

In the reel-to-reel circuit board manufacturing apparatus in which the film body 120 is formed, the substrate 10 and the film body 120 may be moved at the same velocity so as to reduce the frictional force between the substrate 10 and a reel 100 and reduce damage to the substrate during the processes of manufacturing the circuit substrate.

Hereinafter, referring to FIG. 4, a moving structure of the film body in a width direction according to an embodiment of the present disclosure will be described below. The components not shown in FIG. 4 may refer to the descriptions with reference to FIGS. 2 and 3.

Figure 4:
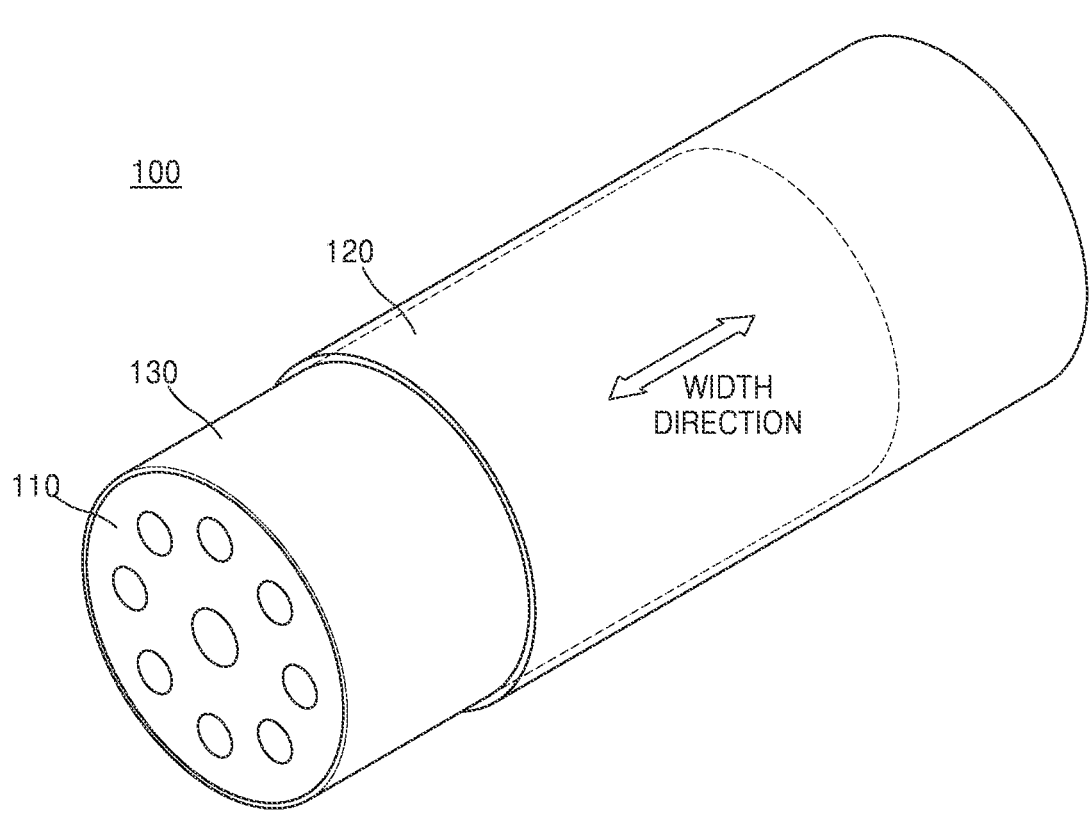
FIG. 4 is a diagram showing a movement structure of a film body in a width direction, according to an embodiment of the present disclosure.

FIG. 4 is a diagram showing a moving structure of the film body 120 in a width direction, according to an embodiment of the present disclosure.

Referring to FIG. 4, the film body 120 according to an embodiment of the present disclosure may move in the width direction of the roller 110, based on the roller 120. That is, the film body 120 is moved separately from the roller 110, may rotate separately from the roller 110 along the rotating direction of the roller 110, and at the same time, may be moved in the width direction of the roller 110.

Figure 1B:
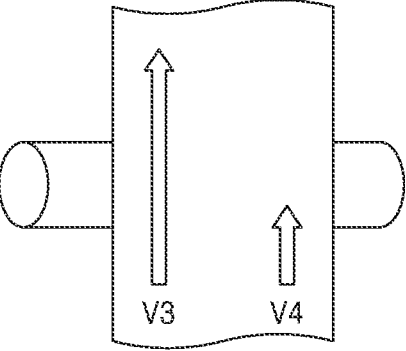

During the reel-to-reel circuit board processes, tensions on left and right sides of the substrate wound on a reel and unwound/wound by left and right sides of the roller may be different from each other. The above situation is shown in FIG. 1B. When the above situation occurs, the moving velocities of the left and right sides of the substrate wound on the reel may be different from each other, and then, the friction force may be applied between the substrate and the reel, and the substrate may be damaged.

According to the present embodiment, the film body 120 formed as a cylinder surrounding the roller 110 is formed to be moved in the width direction of the roller 110, and thus, the film body 120 moving along with the substrate 10 is designed to move in the width direction of the roller 110 according to the difference between the tensions on the left and right sides of the substrate 10. Thus, the friction between the substrate 10 and the roller 110 in the width direction, as well as in the rotating direction, may be reduced.

Hereinafter, referring to FIG. 5, a belt-type reel-to-reel circuit board manufacturing apparatus according to another embodiment of the present disclosure will be described below. The components not shown in FIG. 5 and descriptions thereof may refer to the descriptions with reference to FIGS. 2 to 4.

Figure 5:
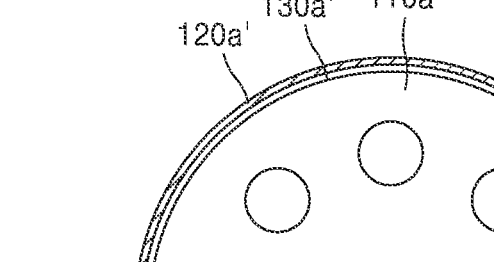
FIG. 5 is a diagram showing a belt-type roller structure according to another embodiment of the present disclosure.

FIG. 5 is a diagram showing a belt-type roller structure according to another embodiment of the present disclosure.

Referring to FIG. 5, the roller according to another embodiment includes a first roller 110a' and a second roller 110b', a first film body 120a' is formed to surround the first roller 110a' and a second film body 120b' may be formed to surround the second roller 110b'.

Here, a first coating portion 130a' is arranged between the first roller 110a' and the first film body 120a', and a second coating portion 130b' may be arranged between the second roller 110b' and the second film body 120b'.

As described above, when the first roller 110a' and the second roller 110b' are separately formed and the substrate 10 is formed to be wound both on the first and second rollers 110a' and 110b', the frictional force between the substrate 10 and the rollers may be reduced through the first and second film bodies 120a' and 120b' on respective rollers. At the same time, a tension T of the substrate 10 wound on the roller may be adjusted by adjusting a distance between the first and second rollers 110a' and 110b' so as to prevent separation of the substrate 10 from the roller.

Hereinafter, referring to FIG. 6, a bearing-type reel-to-reel circuit board manufacturing apparatus according to another embodiment of the present disclosure will be described below. The components not shown in FIG. 6 and descriptions thereof may refer to the descriptions with reference to FIGS. 2 to 4.

Figure 6:
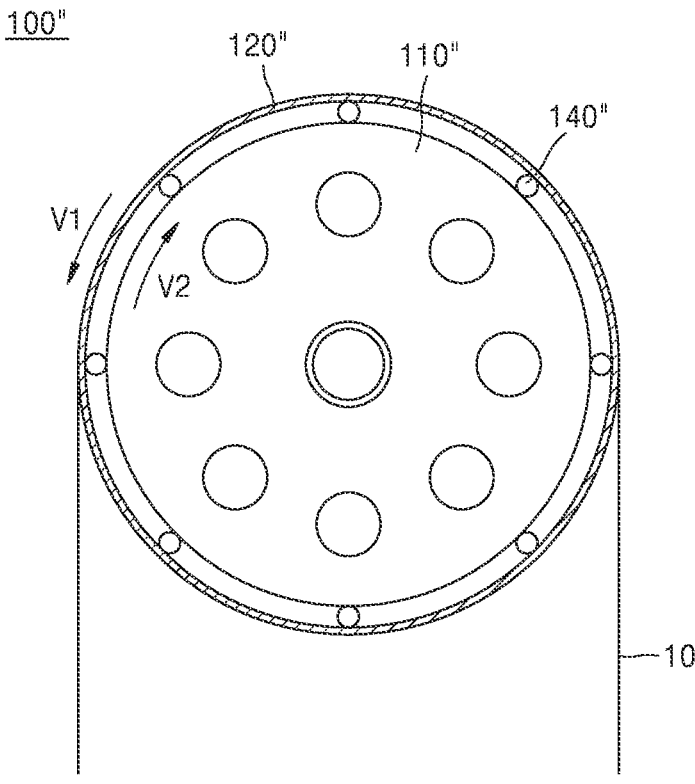
FIG. 6 is a diagram showing a structure of a bearing roller according to another embodiment of the present disclosure.

FIG. 6 is a diagram showing a structure of a bearing roller according to another embodiment of the present disclosure.

Referring to FIG. 6, the reel-to-reel circuit board manufacturing apparatus according to another embodiment of the present disclosure may further include bearings 140" between a roller 110" and a film body 120".

Because the bearings 140", instead of the coating portion, are arranged between the film body 120" and the roller 110", the film body 120" may be formed to be movable in the rotating direction and in the width direction, separately from the roller 110". Because the friction between the film body 120" and the roller 110" rarely exists due to the bearings 140", the moving directions and the moving velocities of the film body 120" and the roller 110" may be totally different from each other.

The particular implementations shown and described herein are illustrative examples of the embodiments and are not intended to otherwise limit the scope of the embodiments in any way. In order to simply and clearly describe the disclosure, the description of the general technology and structure according to the related art may be omitted.

Furthermore, the connecting lines or connectors shown in the drawings are intended to represent example functional relationships and/or physical or logical couplings between the various elements. It should be noted that many alternative or additional functional relationships, physical connections, or logical connections may be present in a practical device. Moreover, no item or component is essential to the practice of the disclosure unless the element is specifically described as "essential" or "critical".

Throughout the specification, in particular, in claims, "the" or other similar referring expressions may refer to both a singular form and a plural form. Unless otherwise defined, the ranges defined herein is intended to include values within the range as individually applied and may be considered to be the same as individual values constituting the range in the detailed description.

Also, operations constituting methods may be performed in appropriate order unless explicitly described in terms of order or described to the contrary. Exemplary embodiments are not necessarily limited to the order of operations given in the description. The examples or exemplary terms (for example, etc.) used herein are to merely describe exemplary embodiments in detail are not intended to limit the embodiments unless defined by the following claims. Also, those of ordinary skill in the art will readily appreciate that many alternations, combinations and modifications, may be made according to design conditions and factors within the scope of the appended claims and their equivalents.

In the reel-to-reel circuit board manufacturing apparatus according to an embodiment of the present disclosure, the substrate and the film body may be moved at the same velocity through the film body that is formed to surround the surface of the roller and is rotated.

Also, in the reel-to-reel circuit board manufacturing apparatus according to an embodiment of the present disclosure, the film body may be moved in the width direction of the roller, so that the friction with respect to the substrate in the rotating direction and the width direction of the roller may be reduced.

The effects of the present disclosure are not limited to the aforementioned effects, and other effects of the present disclosure may be understood by the following description and will become apparent from the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A reel-to-reel circuit board manufacturing apparatus comprising:
   a reel-to-reel circuit board manufacturing roller having a cylindrical shape, configured to rotate, and on which a substrate is wound; and a film body that is formed between the reel-to-reel circuit board manufacturing roller and the substrate so as to surround, substantially enclosing in entirety, a surface of the reel-to-reel circuit board manufacturing roller, the film body being rotatable,
   wherein the reel-to-reel circuit board manufacturing roller and the film body are separately rotated from each other.

2. The reel-to-reel circuit board manufacturing apparatus of claim 1, wherein a frictional force between the film body and the substrate is greater than a frictional force between the film body and the roller.

3. The reel-to-reel circuit board manufacturing apparatus of claim 1, wherein the film body includes a thin plate film.

4. The reel-to-reel circuit board manufacturing apparatus of claim 1, further comprising
   a coating portion coated on the surface of the roller.

5. The reel-to-reel circuit board manufacturing apparatus of claim 4, wherein the coating portion is between the roller and the film body and is integrally rotated along with the roller.

6. The reel-to-reel circuit board manufacturing apparatus of claim 4, wherein the coating portion includes a fluoride-based release coating agent.

7. The reel-to-reel circuit board manufacturing apparatus of claim 4, wherein the coating portion includes a silicone-based release coating agent.

8. The reel-to-reel circuit board manufacturing apparatus of claim 1, wherein the film body is moved in a width direction of the roller on the basis of the roller.

9. The reel-to-reel circuit board manufacturing apparatus of claim 1, wherein the roller includes a first roller and a second roller, the film body includes a first film body and a second film body, and the first film body surrounds the first roller and the second film body surrounds the second roller.

10. The reel-to-reel circuit board manufacturing apparatus of claim 9, further comprising
    a first coating portion arranged between the first roller and the first film body; and
    a second coating portion arranged between the second roller and the second film body.

11. The reel-to-reel circuit board manufacturing apparatus of claim 1, further comprising a bearing arranged between the roller and the film body.

12. The reel-to-reel circuit board manufacturing apparatus of claim 1, wherein the roller and the film body being separately rotated from each other is such that the film body is configured to rotate in both of the same or opposite direction as the roller.

* * * * *